(12) United States Patent
Odintsov

(10) Patent No.: US 8,049,502 B2
(45) Date of Patent: Nov. 1, 2011

(54) TUNABLE RADIO-FREQUENCY COIL

(75) Inventor: Boris Odintsov, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 243 days.

(21) Appl. No.: 12/500,724

(22) Filed: Jul. 10, 2009

(65) Prior Publication Data
US 2010/0013483 A1    Jan. 21, 2010

Related U.S. Application Data

(60) Provisional application No. 61/081,954, filed on Jul. 18, 2008.

(51) Int. Cl.
*G01V 3/00* (2006.01)
(52) U.S. Cl. ........................ 324/318; 324/309
(58) Field of Classification Search .......... 324/300–322; 600/407–445
See application file for complete search history.

(56) References Cited

U.S. PATENT DOCUMENTS

| 4,916,418 | A  | * | 4/1990 | Rath .............................. 333/219 |
| 6,396,271 | B1 |   | 5/2002 | Burl et al. ..................... 324/318 |
| 7,202,668 | B2 | * | 4/2007 | Ludwig et al. ................ 324/318 |
| 7,268,554 | B2 | * | 9/2007 | Vaughan ....................... 324/322 |

FOREIGN PATENT DOCUMENTS
EP     0579473 B1    11/1998

OTHER PUBLICATIONS

Coilcraft, Inc., "7 mm Tunable RF Coils—146,150 Series", Document 109-1, 109-2, Nov. 27, 2002.
Doty, et al., "Practical Aspects of Birdcage Coils", Journal of Magnetic Resonance 138, pp. 144-154, Dec. 18, 1998.

* cited by examiner

*Primary Examiner* — Brij Shrivastav
(74) *Attorney, Agent, or Firm* — Sunstein Kann Murphy & Timbers LLP

(57) ABSTRACT

A radio frequency (RF) coil comprising a plurality of electrically uninterrupted conductive legs, each leg having a first end and a second end, and at least one continuous conductor electrically connected to the first ends of the legs. Frequency tuning of the coil is achieved by translating, along the legs, an electrically continuous tuning band that includes a capacitor closed about the axis of the coil in proximity to the conductive legs. Maintaining electrical symmetry of the coil results in tuning ranges of at least 30 percent of the nominal value of the resonant frequency.

26 Claims, 9 Drawing Sheets

TUNABLE RADIO-FREQUENCY COIL

The present application claims priority from U.S. Provisional Application No. 61/081,954, filed Jul. 18, 2008, the full disclosure of which is hereby incorporated by reference herein.

TECHNICAL FIELD

The present invention relates to tunable radiofrequency (RF) coils such as may be used in magnetic resonance imaging (MRI) and nuclear magnetic resonance (NMR) systems, and, more particularly, to RF coils having wide tuning ranges.

BACKGROUND ART

RF coils play a crucial role in defining the spatial resolution of imaging systems, serving both to transmit excitatory RF signals to the tissues being interrogated and to collect the returning RF-signal information from the body. Magnetic resonance (MR) RF coils are essentially tuned inductors serving as antennae for the transmission or reception of RF signals.

RF coils are typically classified into two broad categories, volume coils and surface coils, differing in their reception characteristics and used in different imaging scenarios. Volume coils, which provide transmission and/or reception over a typically cylindrical or ellipsoidal region circumscribed by the coil, are designed to create RF fields that are, optimally, homogeneous throughout a specified region enclosed by the coil. A conventional birdcage coil is an example of a volume coil that may be used, for example, in neuroimaging applications. U.S. Pat. No. 4,692,705 to Hayes provides a description of such coils. Typically, a cylindrical version of a birdcage coil has a pair of circular end rings which are bridged by a plurality of equi-spaced straight segments or "legs," each of which is interrupted by at least one reactive element. In a primary mode, currents in the legs should be sinusoidally distributed, which results in good uniformity of the distribution of the magnetic field produced by the coil (known as a $B_1$-field) measured along the axis of the coil. The $B_1$-field homogeneity may be improved by increasing the number of legs in the coil. In a typical variation of the birdcage design, additional capacitors may be distributed throughout the two end rings, thus interrupting the continuity of the end rings between adjacent legs, such as in a design described in U.S. Pat. No. 6,396,271 to Burl et al. In contrast to volume coils, surface coils are designed to operate efficiently over a limited spatial region of interest that is immediately adjacent to the coil.

Recent advances in RF coil design and a proliferation of specialized coils aim, in particular, at improving (i) the homogeneity of the magnetic field created by a coil, (ii) its quality factor (Q-factor), and (iii) tunability of its resonant frequency. In the art, the field homogeneity of the commercially available RF coils is generally considered to be satisfactory at fixed frequencies, lower level fields and with average constant loads.

A typical frequency-tuning range for commercially available coils is known to be restricted to 2-3 percent of the resonant frequency. This restriction imposes limitations on MR or NMR measurements. If a coil with extended range of tuning were available, it could allow for employing the same coil to obtain NMR signals from distinct NMR nuclei such as hydrogen isotopes and fluorine-19 labels, for example. A desirable tuning range for such operation is over 6% in order to encompass resonant frequencies of 600 MHz and 560 MHz in magnetic fields on the order of 14 Tesla. Wide tuning RF coil range (up to 30-40% of the resonance frequency) is of a particular interest for studying a variety of samples with different chemical compositions, dielectric (and other) looses, density, size etc.

One of the problems in achieving wide-range frequency tuning of an RF coil is the mutual dependence among the tuning range, the Q-factor, and the field homogeneity inside the coil. The resonant frequency $\omega$ of the RF-coil resonant circuit is determined by its inductance, L, and capacitance, C, as $\omega \propto 1/\sqrt{LC}$. Conventionally, birdcage resonators are tuned by making a small change to the value of resonating capacitors by, for example, connecting variable capacitors in parallel with fixed capacitors or by coupling a second, nearly resonant, circuit to the main coil and adjusting the reactance of the second circuit, typically by means of a variable capacitor. Lumped capacitances, however, make it difficult to achieve broad tuning range while maintaining electrical symmetry of the coil and, as a result, homogeneity of the generated magnetic field.

Burl et al, in U.S. Pat. No. 6,396,271, offered a design aiming to overcome the above-mentioned problems by providing a means for simultaneous tuning of multiple capacitors that interrupt the leg conductors of the coil. The proposed design, however, does not maintain the symmetry of the electrical configuration of the RF-coil circuit during the tuning procedure, which would be desirable to maintain the high value of the Q-factor and the magnetic field homogeneity inside the coil across the available tuning range. In addition, the proposed design faces a problem of local heating of the end ring capacitors. Added capacitors at either the end ring portions or at the leg portions of the RF coil are required. Clearly, then, the addition of multiple capacitors renders tuning the coil to the desired resonant frequency even less certain. The problem of tuning an RF coil across a wide range of frequencies while maintaining the field uniformity and the high Q-factor, therefore, still requires a solution.

SUMMARY OF THE INVENTION

Embodiments of the invention provide an RF coil that has a plurality of continuous conductive legs disposed substantially parallel to the axis of the coil. Each leg has a first end and a second end, and at least one end conductor electrically connects the first ends of the conductive legs. The end conductor that connects the first ends may be a closed-curve conductor such as a ring conductor, for example. Alternatively, the end conductor may be open-ended, such as in the shape of a open ring.

In related embodiments, a second end conductor electrically connects the second ends of the conductive legs. Further embodiments of the RF coil may have a tuning band including a capacitor closed about the axis. By moving the tuning band along the axis, a resonance frequency of the coil can be changed, and the range may be as great as at least thirty percent of the value of the resonance frequency. In one embodiment, the capacitor that encircles the axis may be a cylindrical capacitor disposed outside of the plurality of the conductive legs, and the tuning band may be slidably movable. In specific embodiments, the leg conductors may be disposed with reflectional symmetry about the axis and, possibly, with the distance between any pair of adjacent legs being substantially equal, and the at least one end conductor may be connected to the first ends of the conductive legs in a plane that is perpendicular to the axis. In a related embodiment, the RF coil may further comprise a non-magnetic shield enclosing the leg conductors and the tuning band. Alternatively or in addition, impedance matching capacitors may be electrically connected to the closed cylindrical capacitor.

In another related embodiment, the end conductor may be replaced with a ring capacitor. Alternatively or in addition, the capacitor associated with the tuning band may be a tunable capacitor, wherein the tuning element is variably positionable along the central axis such as to change the effective length of the inductive elements, thereby both varying the inductance of the inductive elements and varying the field of view of the coil from a first field of view to a second field of view substantially different from the first field of view, such that the resonant frequency of the coil associated with the first field of view is substantially the same as the resonant frequency of the coil associated with the second field of view.

In accordance with another aspect of the invention, a transceiver of a magnetic resonance signal is provided, wherein the transceiver comprises an RF-coil assembly and a tuning mechanism configured to change a resonance frequency of the coil assembly by moving the tuning band along the axis. The coil assembly of the transceiver includes at least one conductor having an axis, a plurality of continuous conductive legs disposed substantially parallel to the axis to form a generally cylindrical volume and having first and second ends, and a tuning band having a cylindrical capacitor disposed coaxially with the axis. In a preferred embodiment, the first ends of the conductive legs are electrically connected to the at least one conductor, and the tuning band is moveable along the axis so as to inductively tune the plurality of conductive legs and change a resonance frequency of the coil assembly. The at least one conductor may be closed about the axis. In a related embodiment, the transceiver may further comprise a non-conductive shield enclosing the coil assembly, and a coil support structure enclosing a tuning mechanism.

Yet another embodiment provides a method for tuning an RF coil used in a magnetic resonance apparatus. The RF coil includes at least one closed-curve conductor having an axis. The axis and the closed-curve conductor define a tubular surface. Leg conductors are disposed, in a spaced-apart relation, along the tubular surface. The legs are parallel to the axis and are electrically connected at their first ends to the closed-curve conductor. The RF coil is tuned by positioning the tuning band (including a capacitor closed about the conductive legs) so as to place each and every conductive leg in proximity to and extending along the surface of the capacitor of the tuning band, and translating the tuning band along the leg conductors so as to continuously vary, within a tuning range, the inductance associated with the conductive legs. In a specific embodiment, translation of the tuning band may be accomplished with the use of a worm gear. In a related embodiment, the translation of the tuning band maybe accomplished in such a fashion as to (i) preserve cylindrical symmetry of an electrical circuit of the RF coil across the tuning range, (ii) keep the axial distribution of the magnetic field provided by the coil substantially uniform across the tuning range, and (iii) retain a quality factor of the coil substantially constant across the tuning range. In another related embodiment, the closed-curve conductor may be replaced with a ring capacitor. The capacitor associated with the tuning band also may be a tunable capacitor. In such an embodiment, the method may further include tuning the tunable capacitor so as to continuously vary, within a capacitance tuning range, the capacitance associated with the tunable capacitor.

BRIEF DESCRIPTION OF THE DRAWINGS

The foregoing features of the invention will be more readily understood from the following detailed description, considered with reference to the accompanying drawings, in which.

DETAILED DESCRIPTION OF SPECIFIC EMBODIMENTS

Definitions. As used in this description and the accompanying claims, the following terms shall have the meanings indicated, unless the context otherwise requires:

"Cylinder" and "cylindrical" refer to the surface formed by the points at a fixed radial distance from a given straight line, which is the axis of the cylinder.

A "closed curve" is understood as a curve not having endpoints and enclosing an area.

Figure 1:
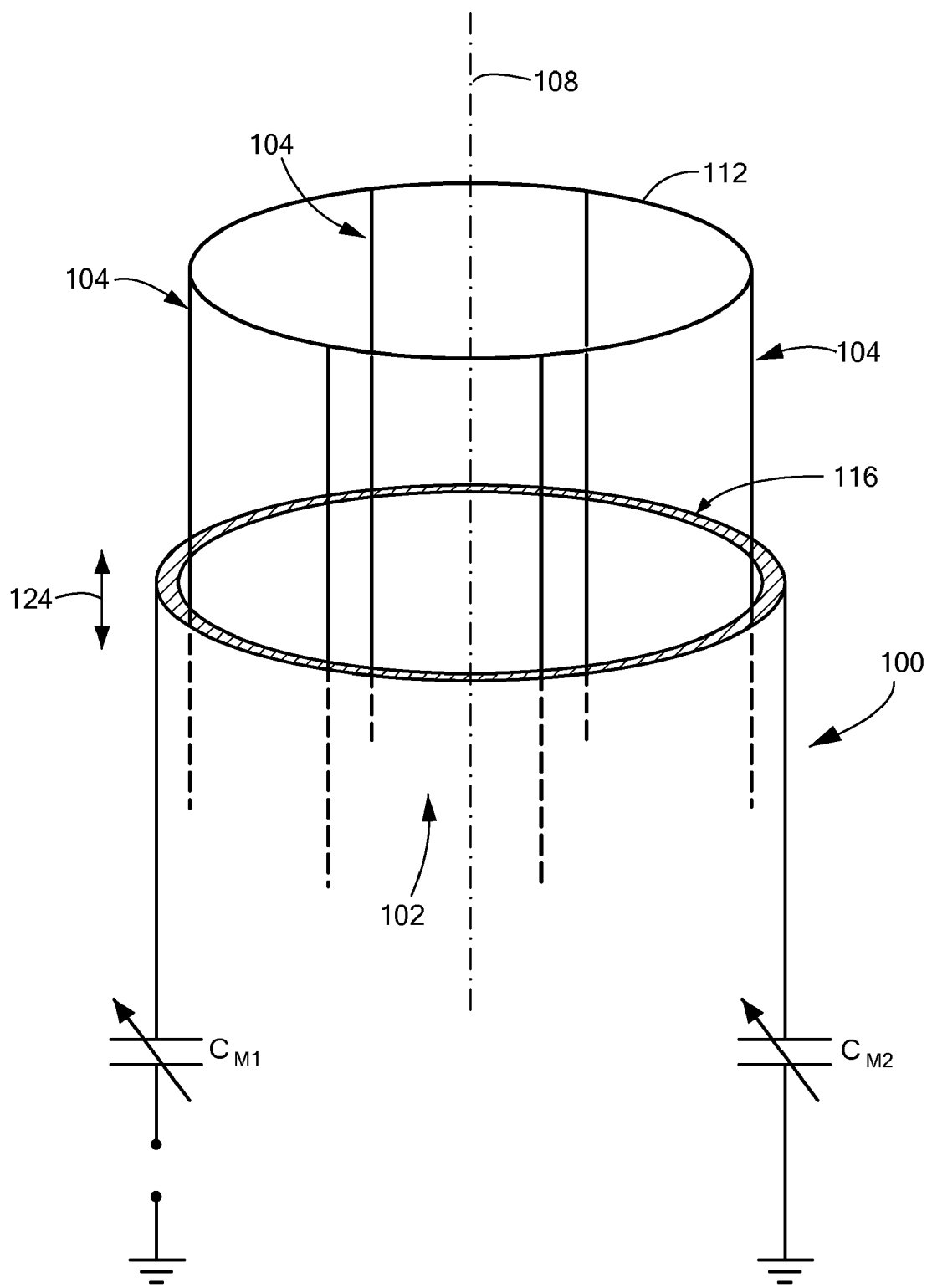
FIG. 1 shows a perspective view of an embodiment of an electrical schematic of the RF coil having a single closed-curve conductor at the first ends of the rod leg conductors and a tuning band movable along the rod leg conductors.
Figure 2:
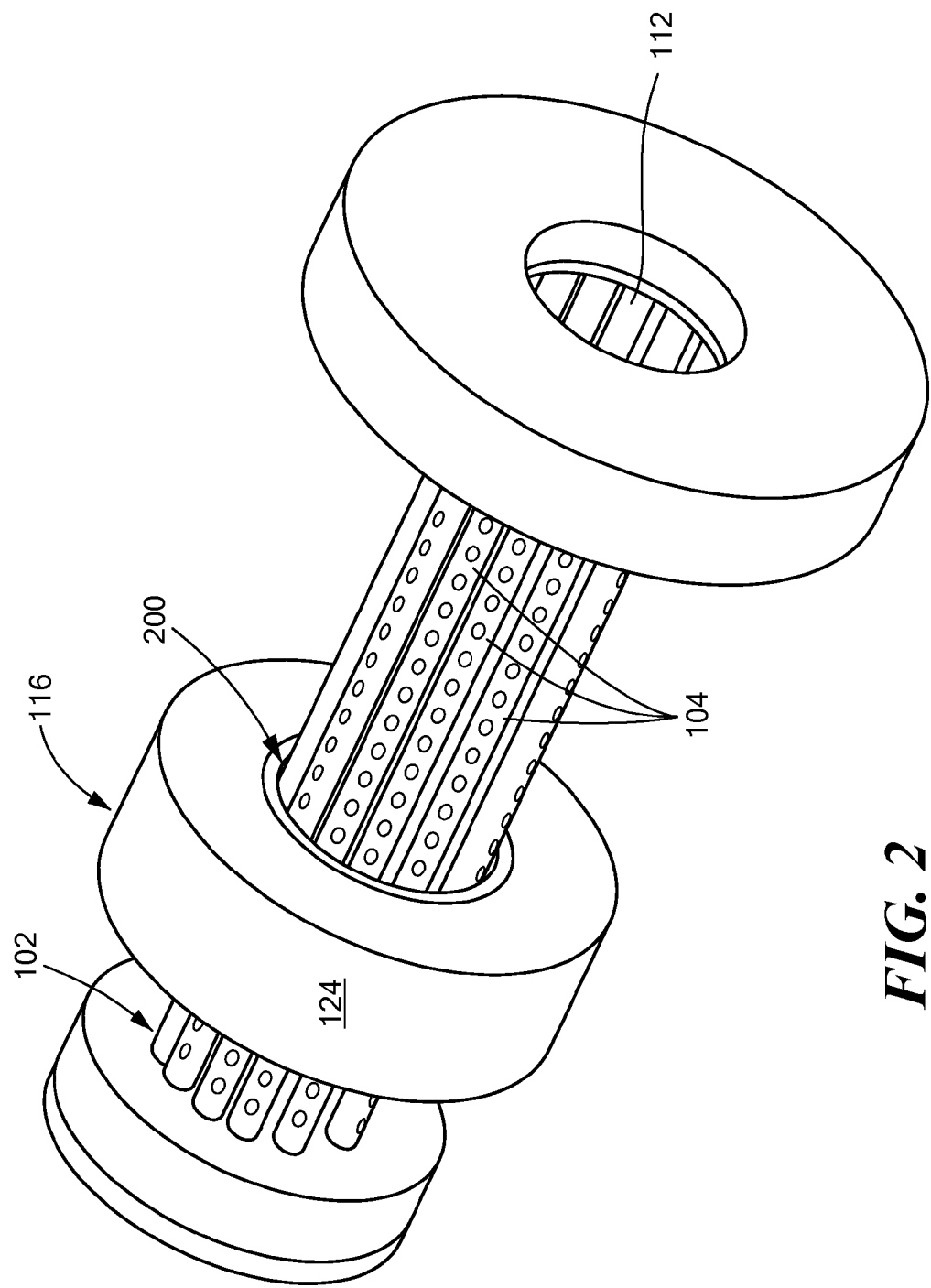
FIG. 2 demonstrates a physical model of the RF coil having the electrical schematic of FIG. 1 and showing in detail a movable tuning band that comprises a cylindrical capacitor.

Embodiments of the invention are based on the empirical finding that a Q-factor and homogeneity of the magnetic field inside the coil, as well as the tuning range, depend on a degree of symmetry of the electrical configuration of the RF-coil circuit and the ability to maintain such symmetry during the coil tuning procedure. Referring now to FIGS. 1 and 2, FIG. 1 shows, in side view, an embodiment of the electrical schematic 100 of the RF coil for use in a magnetic resonance apparatus, while FIG. 2 presents a perspective view of a physical model corresponding to the embodiment 100 of FIG. 1. The embodiment 100 comprises a plurality of conductive legs 104, each leg having two ends. As shown in FIGS. 1 and 2, each conductive leg from the plurality 104 is an inductor and may be constructed as a continuous conductive rod. However, conductive legs may also be constructed as coils of conducting material or be formatted from a conducting element in any other appropriate form known in the art. Each of the conductive legs 104 is disposed, in a spaced-apart fashion, in parallel to the fiducial axis 108. In some embodiments, the legs are spaced equally along their length. The number of legs in a particular embodiment is a matter of design choice. FIG. 2 illustrates an embodiment in which the continuous conductive legs 104 are disposed along a cylindrical surface that is symmetrical about the axis 108. As a result, the conductive legs 104 circumscribed a cylindrical region of space. In another embodiment, the legs 104 may be disposed with reflectional symmetry about the axis 108. Moreover, if a particular embodiment of the magnetic resonance apparatus—such as that used for the whole-body examination and described with reference to FIG. 1 of U.S. Pat. No. 6,396,271, which is incorporated herein by reference in its entirety—requires picking up the MR signals in quadrature, a related specific embodiment of the coil 100 of the invention used in such MR apparatus may contain a multiple of four (i.e., 4, 8, 12, etc) leg conductors to facilitate such quadrature operation.

Referring again to FIG. 1, a conductor 112, disposed in a plane that is perpendicular to the axis 108, electrically interconnects the first ends of the conductive legs in a plane perpendicular to the axis 104, thus providing an electrically closed end for the embodiment 100. In comparison, a plurality of disconnected second ends of the conductive legs 104 form an electrically open end 102 of the RF coil. Physically, however, both ends of the embodiment of the RF coil remain open to facilitate insertion of an object to be imaged using MR techniques as known in the art. Although, as shown in FIG. 1, the conductor 112 is a closed-curve conductor, generally such a conductor may have its own end points and does not have to be closed upon itself. It is noted that a second conductor (whether closed-curve or open-curve) may be added to the electrical schematic of the coil so as to interconnect the second ends of the conductive legs 104, as further discussed below with reference to FIG. 5. For example, both the first and the second closed-curve end conductors may be disposed in planes that are perpendicular to the axis 108. As will be understood from the following discussion, the presence of such optional second end conductor does not alter the principle of operation of the embodiment of the invention. It shall be appreciated that neither conductive legs 104 nor the end conductor 112 (nor a second, optionally present conductor interconnecting the second ends of the conductive legs 104) of the embodiment of the invention is interrupted with reactive elements.

The RF-coil embodiment 100 further comprises a tuning band 116 for tuning the resonant frequency of the RF-coil. This tuning band includes a capacitor closed about an axis that is parallel to the axis 108. Such closed capacitor may be a capacitor comprising a first tubular conductor and a second tubular conductor disposed within and longitudinally co-aligned with the first tubular conductor, the first and second tubular conductors spaced apart and separated by an intervening dielectric material, wherein each tubular conductor defines a simple closed curve in a cross section. A cylindrical capacitor having both of its conducting plates be cylindrical shells that are co-axial with the axis 108 provides an example of a capacitor that is closed about the axis 108.

The tuning band is generally movable, as indicated with an arrow 124 in FIG. 1, along the axis 108 continuously and in proximity to the conductors 104, from which the closed capacitor of the tuning band 116 is electrically separated. The closed capacitor may be mounted on the inner surface of a non-conductive support tube extending along the axis 108 and around the conductive legs 104. For example, as shown in the embodiment of FIG. 2 where the conductive legs 104 form a generally cylindrical volume, the closed capacitor 200 is preferably cylindrically shaped so as to provide a uniform electrical coupling with the conductive legs, and may be mounted on the inner surface of a cylindrical supporting tube 124 made of acrylic glass (PMMA) or Virgin Teflon®. It shall be understood that the supporting tube or other structure employed as a carrier for a closed capacitor of the tuning band may be made of any other suitable dielectric material. The cylindrically shaped closed capacitor 200 may have both of its conducting plates be cylindrical shells, with the first plate disposed within and coaxially with the second plate, and be closed about the axis 108. In an alternative embodiment (not shown), the closed capacitor may be appropriately mounted on the outer surface of a non-conductive supporting stage that is movable inside the cage formed by the conductive legs 104. Additionally, matching capacitors $C_{M1}$ and $C_{M2}$ may be employed to match the impedance of the coil that encloses an object being imaged to that of a peripheral 50 Ohm cable connecting the coil to the measuring device such as a spectrometer.

Tuning an embodiment of the RF coil to the desired resonant frequency may be accomplished by translating the tuning band 116 along the axis 108 so as to vary the effective inductance L of the conductive legs 104 while maintaining the capacitance C, of the closed capacitor, constant. It shall be appreciated that, by virtue of the capacitor 200 of the tuning band 116 being a cylindrical, axially symmetrical capacitor, the tuning is conducted in an optimal manner that preserves the overlap between the closed capacitor of the tuning band and any conductive leg 104 to remain substantially uniform throughout the tuning procedure. As a result, the electrical symmetry of the circuit of the RF coil 100 remains substantially unperturbed throughout the tuning, which allows for optimal distribution of the $B_1$ field inside the coil, optimal adjustment of the effective inductance and, therefore, optimal tuning of the coil's resonant frequency.

Figure 3:
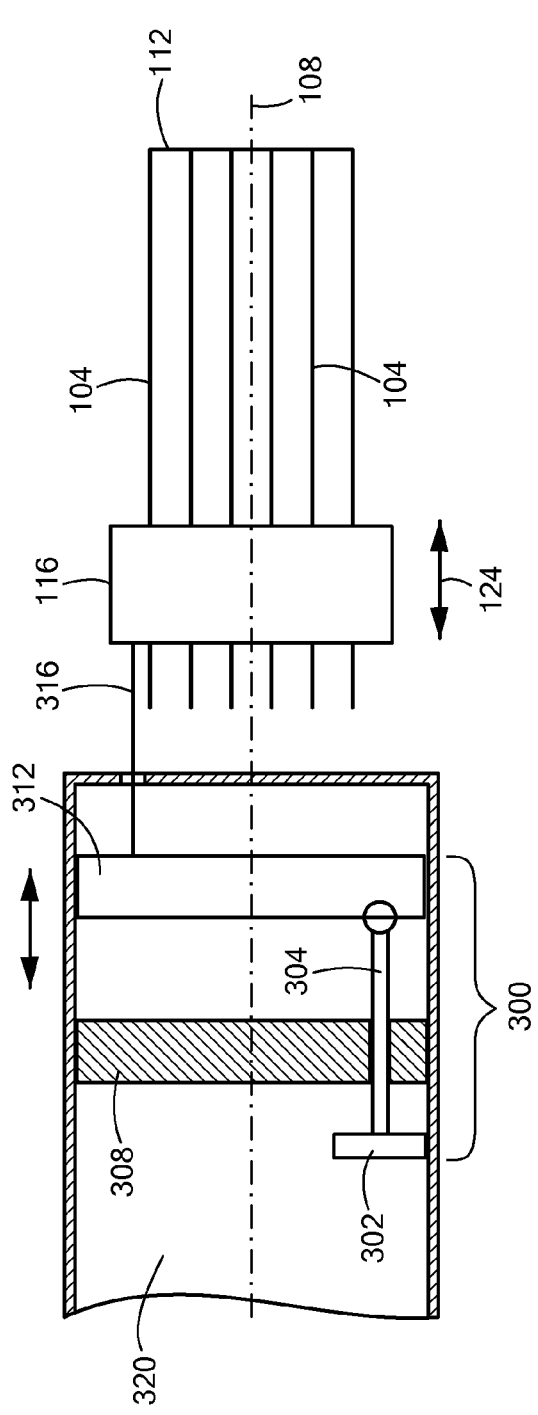
FIG. 3 presents schematically an embodiment of a mechanism for frequency tuning of the embodiment of FIG. 1.

Referring now to FIG. 3, one embodiment of a RF-coil tuning mechanism 300 employed to translate the tuning band 116 of FIG. 1 along the axis 108 may be implemented as a worm-drive and comprise a frequency-tuning regulator 302. As shown, the regulator 302 operates a screw 304 that passes through a threaded opening in a fixed block 308 and pushes or pulls, depending on the direction of the screw rotation, a movable block 312, which, in turn, transfers its movement along the axis 108 to the tuning band 116 through, e.g., a rigid non-conducting connector 316. Accordingly, the tuning band is being translated along the axis 108 (i.e., along the z-axis as shown in FIG. 3). When the tuning band 116 moves in a +z direction (i.e., away from the mechanism 300), the effective length of the conductive legs 104 in the RF coil embodiment is being reduced, and a corresponding resonant frequency of the RF coil embodiment increases. In comparison, the translation of the tuning band in a −z direction leads to the decrease of the resonant frequency.

The frequency tuning regulator 302 may comprise a piezoelectric driver employed to rotate the screw 304. The screw 304, such as a differential screw, for example, may have a thread with a pitch suitable for fine repositioning of the tuning band 116 as desired for a particular application. It shall be appreciated, however, that any other actuating means of translating and positioning, known in the art, may be employed for translating the tuning band 116 along the conductive legs 104. For example, crossed roller slides, bearings, or servo-pneumatic positioners and actuators, among other means known in the art, may be suitably utilized in various embodiments. As shown in FIG. 3, the tuning mechanism 300 may be enclosed in a coil support tube 320 that may simultaneously serve as a handle for insertion of the RF coil into the middle of a magnet of the MR system.

Figure 4:
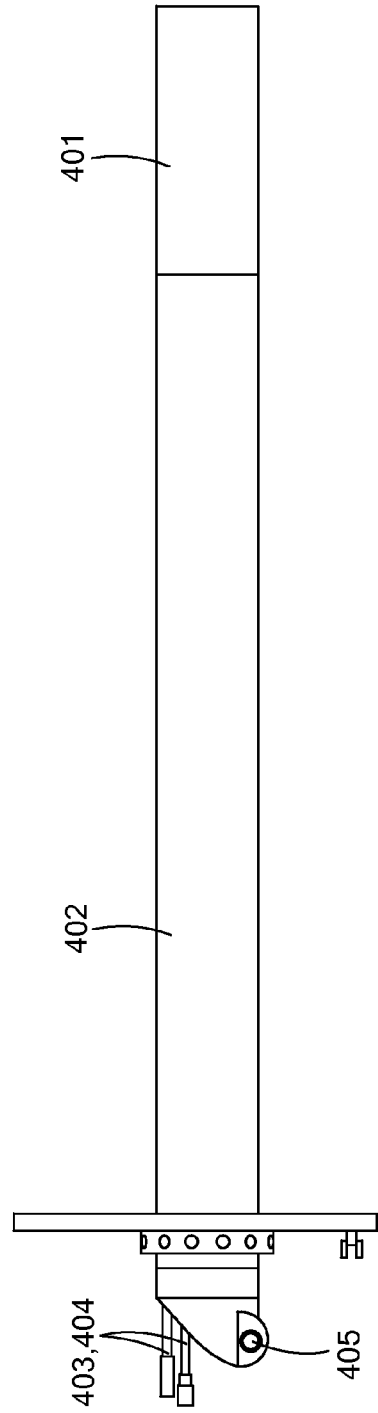
FIG. 4 shows a physical model of an RF coil of the invention corresponding to the embodiments of FIGS. 1 and 3.

FIG. 4 demonstrates a perspective view of an embodiment of the assembly of the invention that comprises an RF-coil portion (enclosed within a non-magnetic shield 401) affixed to a coil support tube 402 that provides housing for the tuning mechanism (not shown) and has electrical outlets for the tuning regulator 403, matching capacitors 404, and the transceiver connectors 405. Here, the conductive legs of about 2 mm in diameter form a cylindrically shaped cage of the coil with dimensions of about 25 mm by 140 mm, covered with a copper shield, with an overall length of the assembly, including the supporting tube, of about 6,500 mm.

Figure 5A:
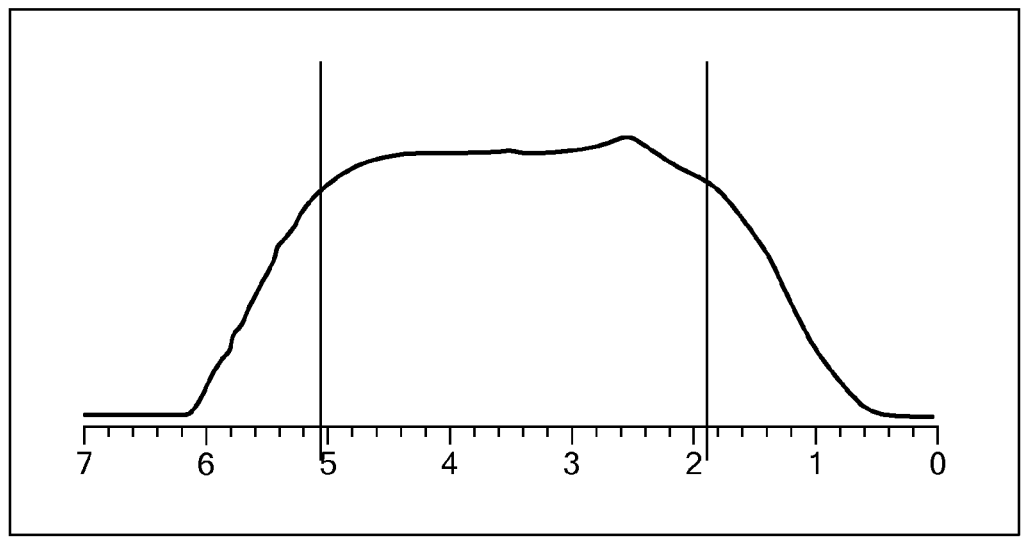
FIGS. 5A-5B demonstrate the uniformity of the axial distribution of the magnetic field formed within the embodiment of FIG. 4 in comparison with that of a commercially available RF coil.
Figure 5B:
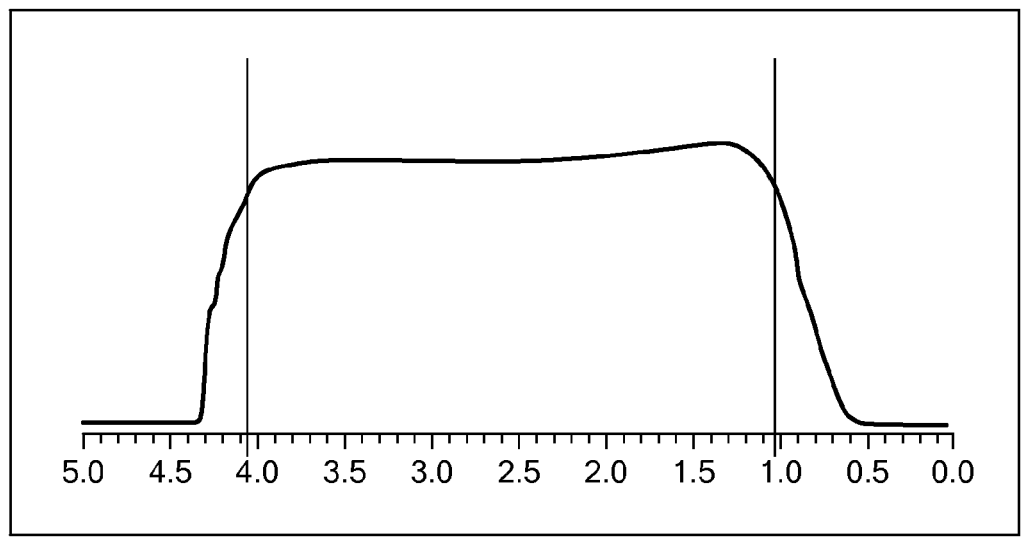

An axial profile of the field, generated by a commercially available coil such as Varian Liquid State Probe SW60PDMN03, is depicted in FIG. 5(A). In comparison, the magnetic field, generated by an embodiment of the coil in operational regime that provides the optimal signal-to-noise ratio, is shown in FIG. 5(B) and demonstrates a substantially uniform axial profile. For example, in one embodiment, a coil of the invention has an inner diameter, ID, of about 20 mm, and a cylindrical 100 mM saline sample occupies about 75 percent of the ID of the coil. The magnetic field $B_1$ is measured at 90 degree, 18 microsecond and substantially Gaussian-shaped RF pulses at 600 MHz, with about 50 W of transmitted power.

Figure 6:
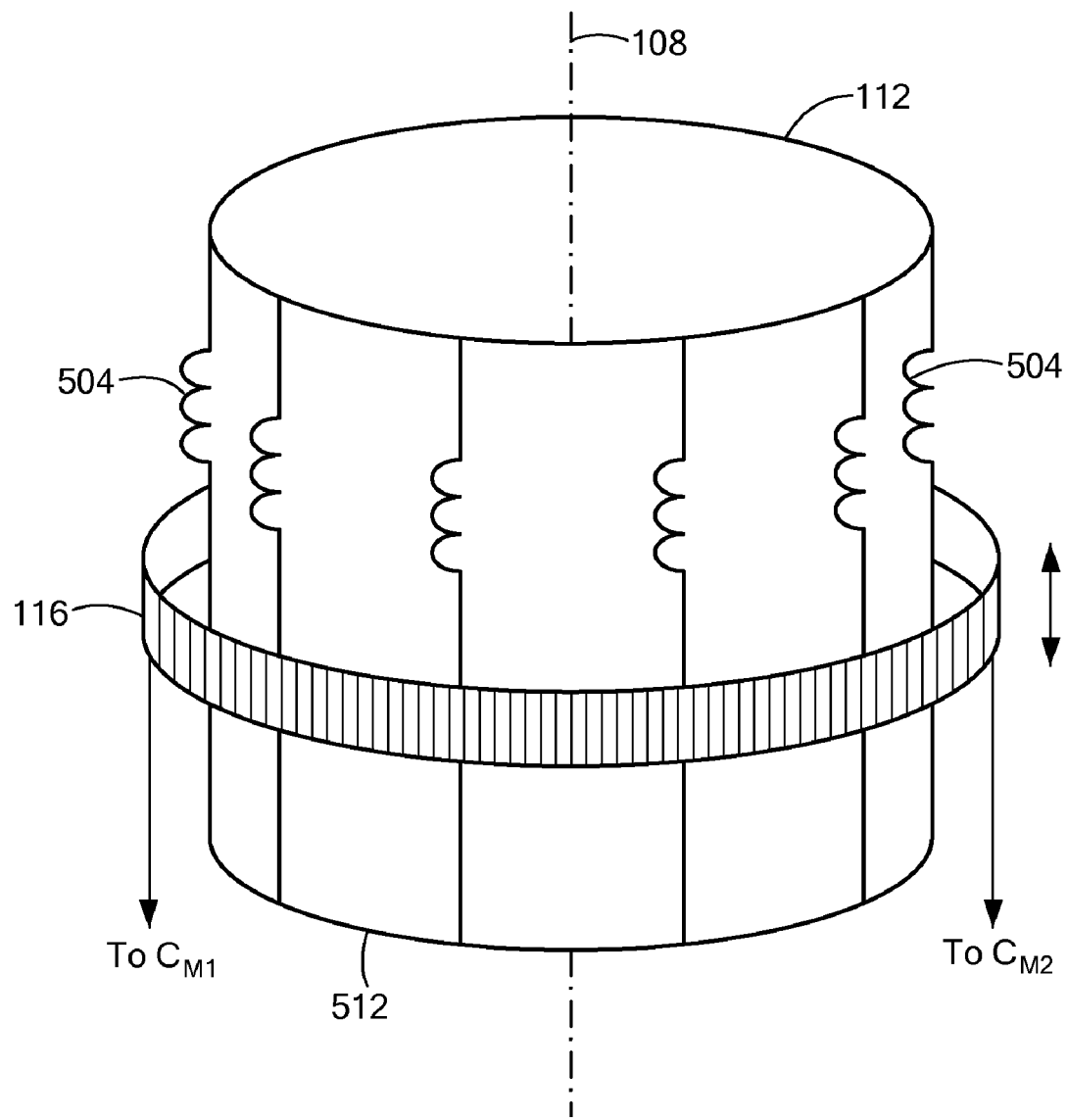
FIG. 6 shows a perspective view of an alternative embodiment of an electrical schematic of the RF coil of the invention with two closed-curve conductors located at the opposite ends of the plurality of the wire-bound leg conductors.

In one alternative embodiment, as shown in FIG. 6, the conductive legs 504 of the tunable RF coil may be formatted as wire coils and have both their first and second ends electrically closed with closed-curve conductors, 112 and 512. In another alternative embodiment, for example, a closed-curve conductor 112 may generally be disposed so that it does not lie within a single plane. In another related embodiment, the at least one conductor connected to the first ends of the conductive legs may generally be not closed (i.e., have its own endpoints), provided that a number of closely spaced conductive legs is large enough to sustain substantial axial symmetry of the magnetic field within the coil across the whole tuning range.

Figure 7B:
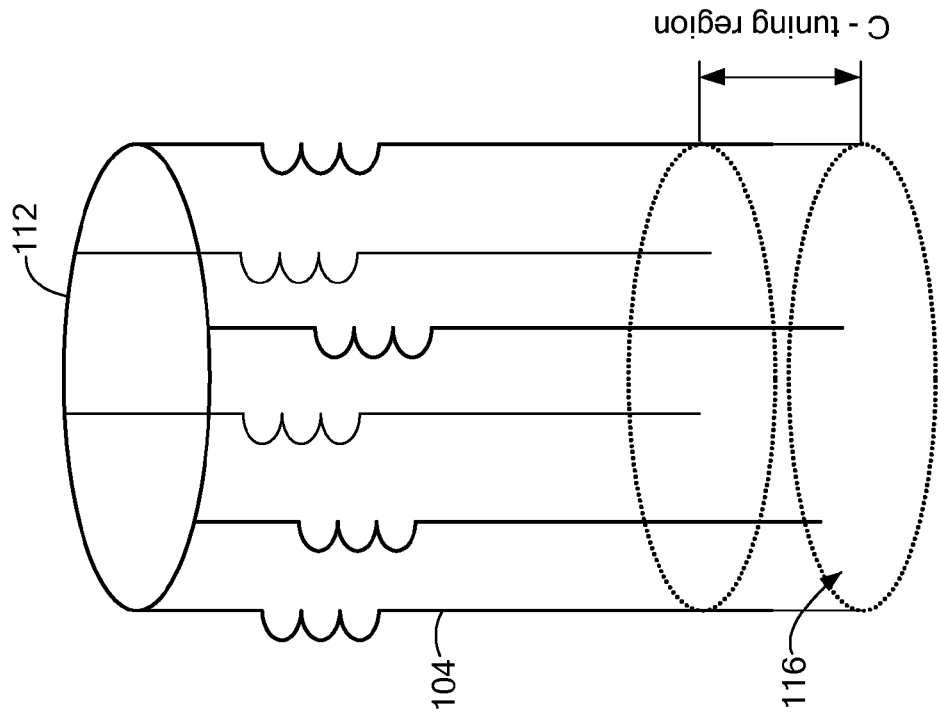
FIGS. 7A-7B show perspective views of an alternative embodiment of an electrical schematic of the RF coil having two distinct tuning modes.
Figure 7A:
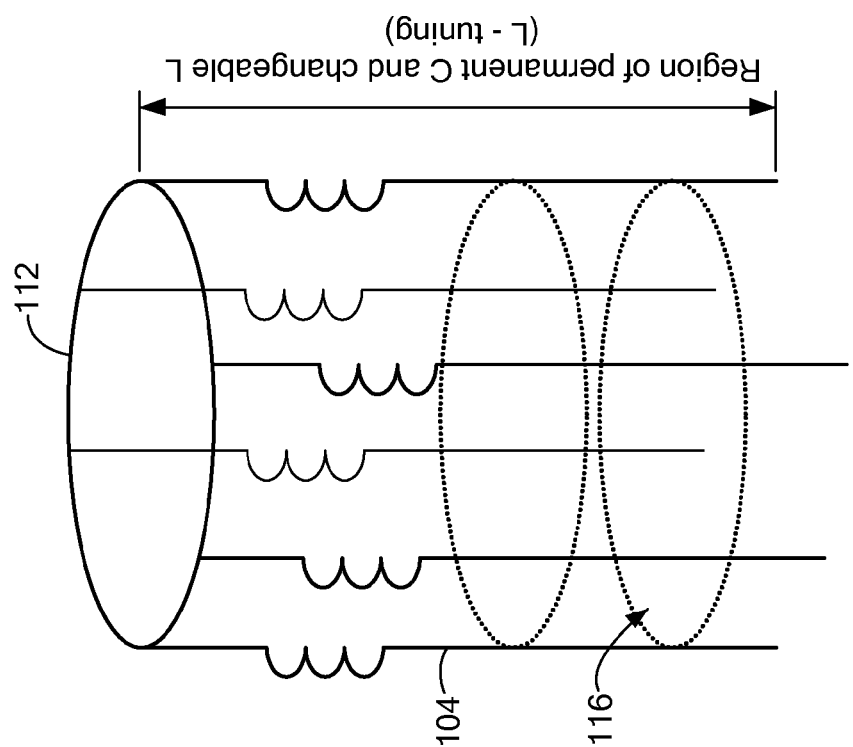
Figure 8:
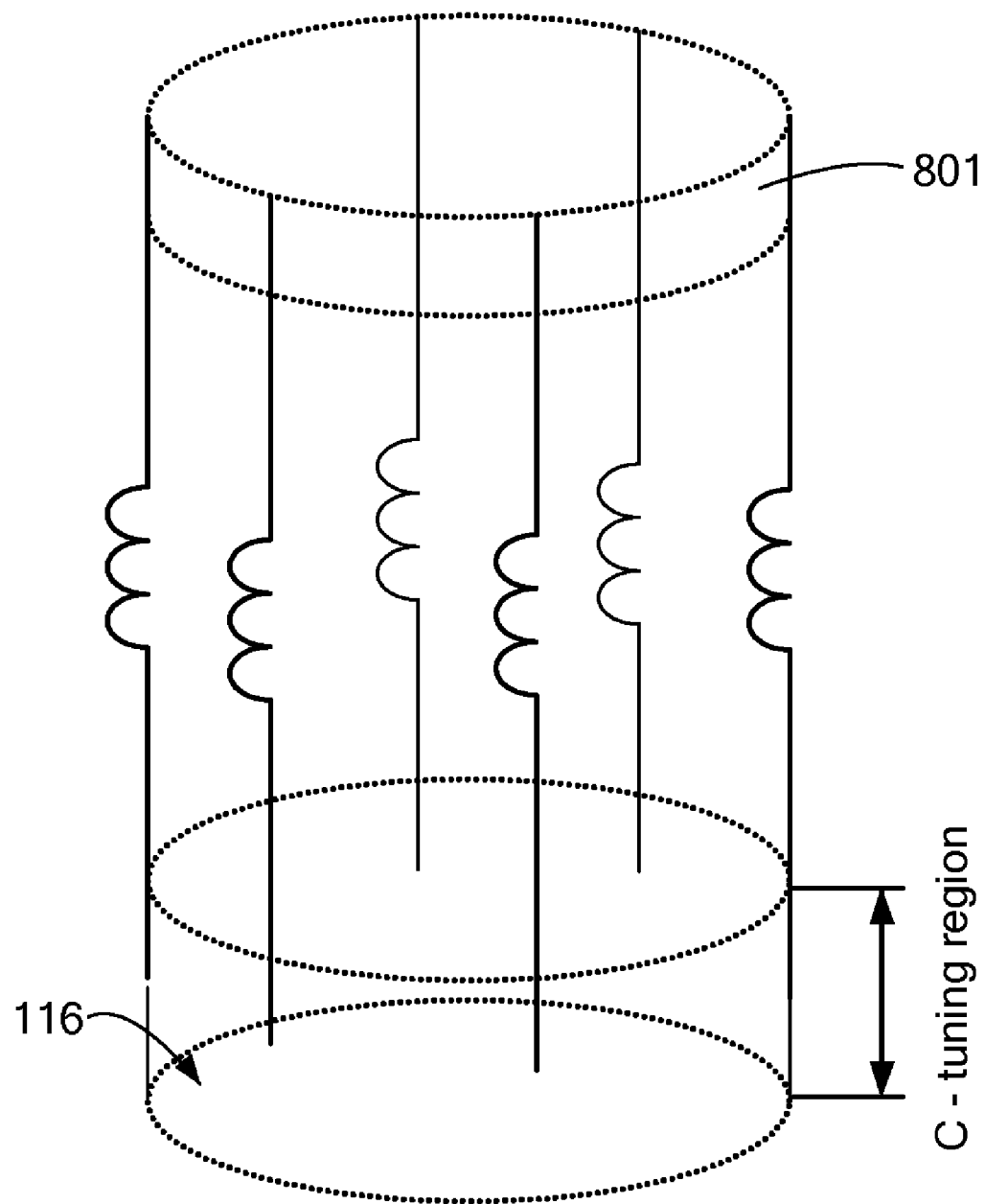
FIG. 8 shows a perspective view of an alternative embodiment of an electrical schematic of the RF coil having a ring capacitor at the first ends of the rod leg conductors.

In another related embodiment, shown in FIGS. 7A-7B, two distinct tuning modes are provided. A related embodiment is shown in FIG. 8, in which the closed-curve conductor has been replaced by a ring capacitor 801.

As shown in FIG. 7A, one embodiment can operate in a first tuning mode, wherein a capacitance associated with the tuning band 116 remains constant while the inductance of the conductive legs 104 is adjusted by displacing the tuning band 116 along the central axis of the coil. In a second tuning mode as shown in FIG. 7B, if the tuning band 116 is displaced to a position such that a portion of the tuning band 116 passes beyond the second end of the conductive legs 104, the effective capacitance associated with the tuning band 116 decreases. The effective capacitance is attributable, at least in part, to capacitance between the tuning band and conductive legs 104, as separated by a dielectric material. The farther past the end of the conductive legs 104 the tuning band 116 passes, the greater the decrease in effective capacitance. In principle, the capacitance associated with the tuning band 116 can be decreased all the way to zero by displacing the tuning band 116 completely past the end of the conductive legs 104. In practice, it is preferred to maintain an overlap of the tuning band 116 and the conductive legs 104 of at least approximately one half of the thickness of the tuning band 116.

A field of view of the coil of FIGS. 7A and 7B is defined by the axial distance between the top edge of the tuning band 116 and the closed-curve conductor 112. Thus FIG. 7A shows the coil adjusted to have a smaller field of view than the field of view associated with the adjustment shown in FIG. 7B. In the embodiment shown in FIG. 8, the field of view is governed by the axial distance between the top edge of the tuning band 116 and the bottom edge of the ring capacitor 801.

Figure 9:
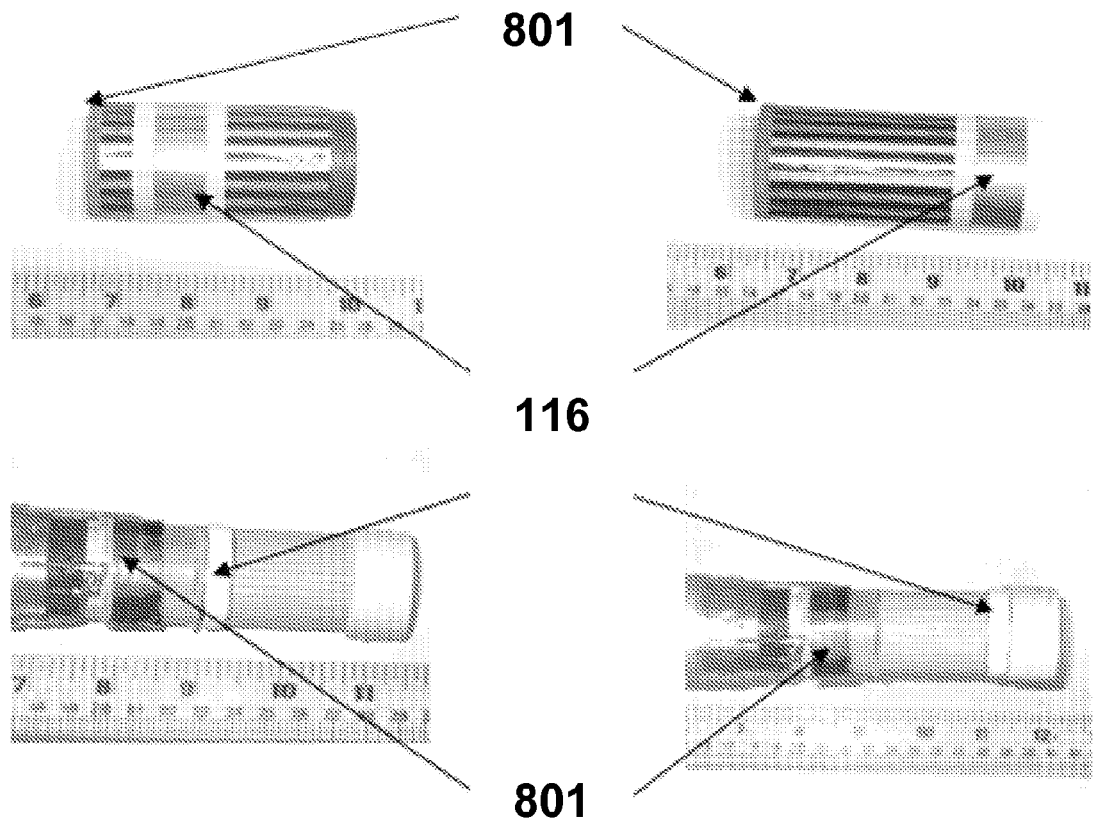
FIG. 9 shows physical models of an RF coil of the invention corresponding to the embodiments of FIGS. 7A-7B and FIG. 8.
Figure 10B:
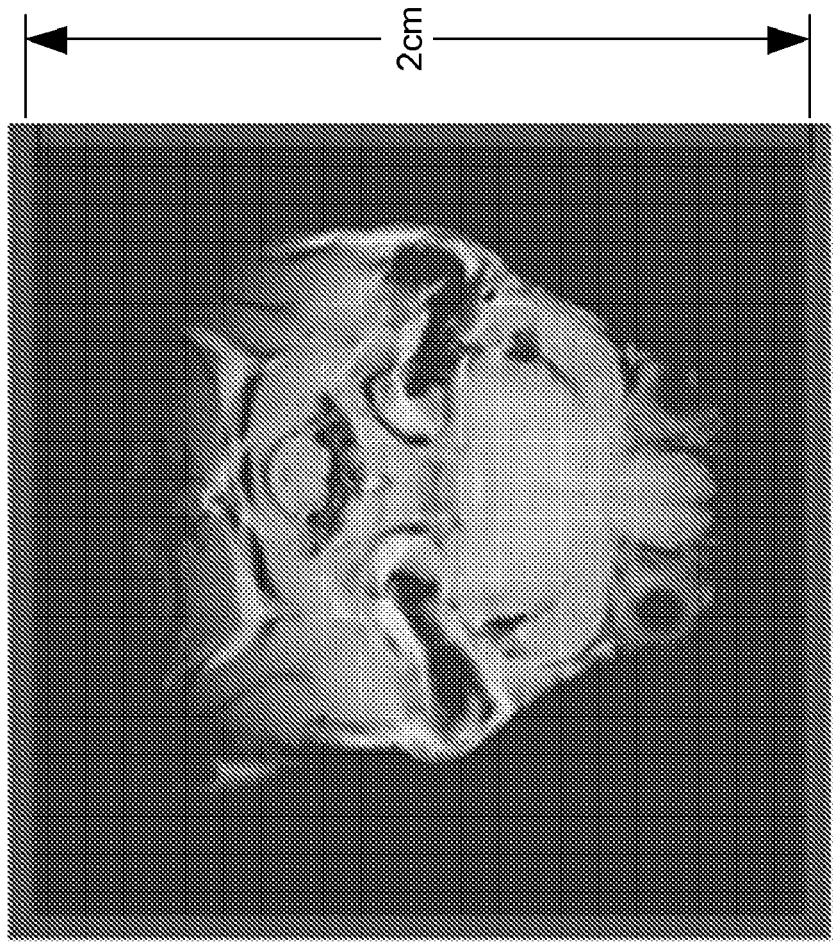
FIGS. 10A-10B show images generated with an RF coil of the invention corresponding to the embodiments of FIGS. 7A-7B and FIG. 8.
Figure 10A:
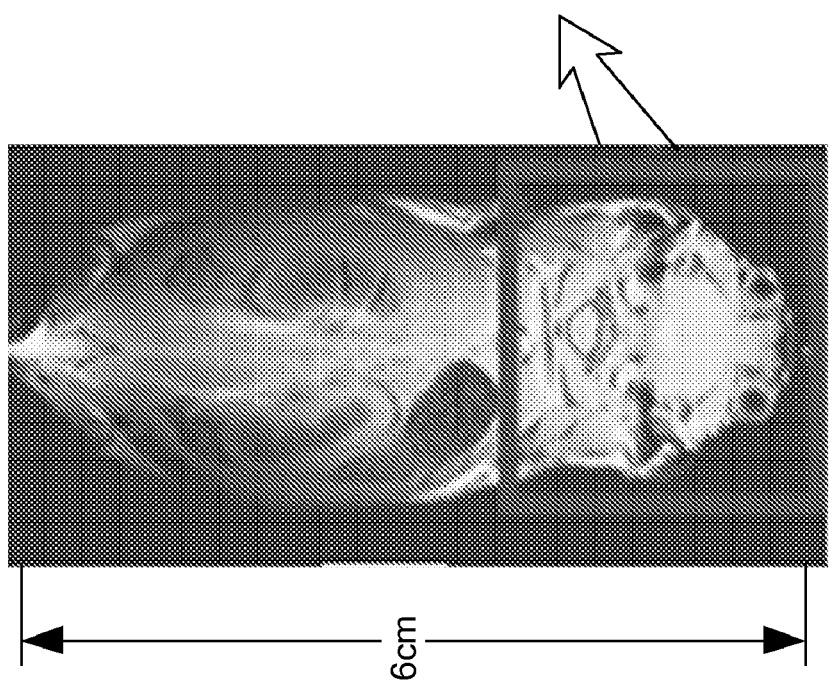

The availability of the two tuning modes allows the field of view of the coil to be adjusted in such a way that the resonant frequency of the coil at one tuning band displacement is substantially the same as the resonant frequency of the coil at a second tuning band displacement. It is preferable to achieve such a mode of operation wherein the resonant frequency may be set to certain predetermined values for distinguishing specific materials in an image scan. FIGS. 7A and 7B, for example, show how a particular resonant frequency might be achieved for two distinct fields of view. The resonant frequency of the coil is related to both the effective capacitance and the effective inductance. In the configuration of FIG. 7A, an effective inductance L and an effective capacitance C are associated with a resonant frequency, $\omega$. In the configuration of FIG. 7B, the tuning band 116 has been displaced so as to be located farther from the closed-curve conductor 112, thereby increasing the effective length of the conductive legs 104, and thus increasing the effective inductance. However, the capacitor of the tuning band 116 has passed beyond the open end of the conductive legs 104, and thus has a reduced effective capacitance. By positioning the tuning band 116 properly, the decrease in effective capacitance and the increase in effective inductance can be balanced such that the resonant frequency of the coil in the new configuration is also $\omega$, as desired. Physical models demonstrating tuning of an RF-coil in this manner are provided in FIG. 9, and exemplary images generated in such a manner are shown in FIG. 10. The coils on the left side of FIG. 9 are tuned according to the first tuning method, wherein the tuning band 116 is closer to the ring capacitor 801. The coils on the right side of FIG. 9 are tuned according to the second tuning method, wherein the tuning band 116 is farther from the ring capacitor 801, such that the effective inductance is higher, while the effective capacitance is lower, than in the configurations shown on the left side of FIG. 9.

An important factor in the utility of adjusting a field of view is the degree of adjustment available. If only a very small change is available, the utility of adjusting the field of view to generate images at the new field of view may be only marginal, because the images at both fields of view may be relatively similar. Thus it is preferable to provide for a field of view adjustment having a sufficient amount of adjustment to have significant utility.

In the embodiment shown in FIG. 8, a degree of available adjustment of the field of view at a particular resonant frequency can be determined by selecting an appropriate capacitance for the ring capacitor 801. For a given resonant frequency that can be reached at two different fields of view, a larger capacitance of the ring capacitor 801 will be associated with a greater degree of field of view adjustment. This is because in the first tuning mode, the effective inductance of the conductive legs 104 must be reduced further to balance the greater overall effective capacitance. As a result, the distance between the tuning band 116 and the ring capacitor 801 will be smaller, and thus the field of view will be smaller, as well.

Embodiments of the present invention may advantageously provide for improved image quality by reducing alias artifacts. One aspect of embodiments of the present invention that can contribute to reduced aliasing is the rectangular $B_1$-field profile of the coil, as illustrated in FIG. 5(B). Because of the sharp drop-off at the edges, such a $B_1$-field profile will be less prone to lead to sampling areas of a subject being scanned that lie outside of the field of view, and thus will be less prone to lead to alias artifacts.

The availability of multiple fields of view also can allow for improved image quality in embodiments of the present invention. Using the larger of the available fields of view may further reduce or eliminate alias artifacts by bringing the entire subject into the field of view. Using the smaller of the available fields of view, on the other hand, may increase image resolution without the need to increase sampling and thus increase image acquisition time. Alternatively, images of a particular area of interest may be acquired using multiple fields of view. In such a case, the image data acquired using the different fields of view may be combined to provide a more accurate composite image. This approach would be based on the principle that significant differences in the images within the area of interest are likely to be alias artifacts, and can thus be removed.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A radio-frequency coil for use in a magnetic resonance apparatus, the radio-frequency coil characterized by a resonant frequency and comprising:
   a plurality of continuous conductive legs, each leg having a first end and a second end, each leg disposed substantially parallel to an axis; and
   a tuning band forming a capacitor closed about the axis, the tuning band movable along the axis so as to change the resonance frequency of the coil.

2. A radio frequency coil according to claim 1, further comprising:
   at least one conductor electrically connected to the first ends of the continuous conductive legs.

3. A radio frequency coil according to claim 1, further comprising:
   at least one ring capacitor electrically connected to the first ends of the continuous conductive legs.

4. A radio-frequency coil according to claim 1, wherein the conductive legs are disposed with reflectional symmetry about the axis.

5. A radio-frequency coil according to claim 1, wherein the at least one conductor is electrically connected to the first ends of the conductive legs in a plane perpendicular to the axis.

6. A radio-frequency coil according to claim 1, wherein the at least one conductor is a closed-curve conductor.

7. A radio-frequency coil according to claim 1, wherein the distance between any pair of adjacent legs is substantially equal.

8. A radio-frequency coil according to claim 1, wherein the capacitor closed about the axis is a cylindrical capacitor.

9. A radio-frequency coil according to claim 6, wherein the closed-curve conductor is a ring conductor.

10. A radio-frequency coil according to claim 1, wherein the capacitor closed about the axis is disposed outside of the plurality of conductive legs.

11. A radio-frequency coil according to claim 1, wherein the tuning band is slidably movable.

12. A radio-frequency coil according to claim 1, further comprising a non-magnetic shield enclosing the conductive legs and the tuning band.

13. A radio-frequency coil according to claim 1, further comprising impedance matching capacitors electrically connected to the cylindrical capacitor.

14. A radio-frequency coil according to claim 1, wherein a range of change of the resonance frequency is at least 30 percent of a value of the resonance frequency.

15. A transceiver of a magnetic resonance signal, the transceiver comprising:
   a coil assembly including
      at least one conductor having an axis,
      a plurality of conductive legs, each leg having a first end and a second end, each first end electrically connected to the at least one conductor and disposed substantially parallel to the axis to form a generally cylindrical volume, and
      a tuning band comprising a cylindrical capacitor disposed coaxially with the axis, the tuning band movable along the axis so as to inductively tune the plurality of continuous conductive legs; and
   a tuning mechanism configured to change a resonance frequency of the coil assembly by moving the tuning band along the axis.

16. A transceiver according to claim 15, wherein the at least one conductor is a conductor closed about the axis.

17. A transceiver according to claim 15, further comprising a non-conductive shield enclosing the coil assembly.

18. A transceiver according to claim 15, further comprising a coil support structure enclosing the tuning mechanism.

19. A method for tuning a radio-frequency coil used in a magnetic resonance apparatus, the coil including at least one closed-curve conductor having an axis, the axis and the at least one closed-curve conductor defining a tubular surface along which are disposed, in a spaced-apart relation, conductive legs, each leg having a first and a second ends, the legs being parallel to the axis and electrically connected, at their first ends, to the at least one closed-curve conductor, the method comprising:
   positioning a tuning band including a capacitor having a surface, wherein the capacitor is closed about the axis, so as to place each and every conductive legs in proximity to and extending along the surface; and
   translating the tuning band along the conductive legs so as to continuously vary, within an inductance tuning range, the inductance associated with the conductive legs.

20. A method according to claim 19, wherein the capacitor closed about the axis is a cylindrical capacitor enclosing the conductive legs.

21. A method according to claim 19, wherein translating of the tuning band preserves a cylindrical symmetry of an electrical circuit of the radio-frequency coil.

22. A method according to claim 19, wherein an axial distribution of a magnetic field produced within the radio-frequency coil remains substantially uniform across the tuning range.

23. A method according to claim 19, wherein a quality factor of the radio-frequency coil remains substantially constant across the tuning range.

24. A method according to claim 19, wherein translating the tuning band is accomplished with the use of a worm gear.

25. A method for tuning a radio-frequency coil used in a magnetic resonance apparatus, the coil including at least one ring capacitor having an axis, the axis and the at least one ring capacitor defining a tubular surface along which are disposed, in a spaced-apart relation, conductive legs, each leg having a first and a second ends, the legs being parallel to the axis and electrically connected, at their first ends, to the at least one ring capacitor, the method comprising:
   positioning a tuning band including a tunable capacitor having a surface, wherein the tunable capacitor is closed about the axis, so as to place each and every conductive legs in proximity to and extending along the surface;
   translating the tuning band along the conductive legs so as to continuously vary, within a tuning range, the inductance associated with the conductive legs; and
   tuning the tunable capacitor so as to continuously vary, within a capacitance tuning range, the capacitance associated with the tunable capacitor.

26. A radio-frequency coil according to claim 1, wherein the radio-frequency coil is characterized by a field of view, the plurality of continuous conductive legs are each characterized by an inductance, and the tuning band is variably positionable along the axis such as to change the effective length of the continuous conductive legs, thereby both varying the inductance of the continuous conductive legs and varying the field of view of the coil from a first field of view to a second field of view substantially different from the first field of view, in such a manner that the resonant frequency of the coil associated with the first field of view is substantially the same as the resonant frequency of the coil associated with the second field of view.

* * * * *